United States Patent [19]

Tanaka

[11] Patent Number: 5,717,289
[45] Date of Patent: Feb. 10, 1998

[54] THIN FILM ELECTROLUMINESCENT ELEMENT EASILY REGULATING EMITTED LIGHT TO WHITE

[75] Inventor: Taizou Tanaka, Tokyo, Japan

[73] Assignee: NEC Corporation, Tokyo, Japan

[21] Appl. No.: 791,774

[22] Filed: Jan. 29, 1997

[30] Foreign Application Priority Data

Jan. 30, 1996 [JP] Japan ................. 8-014402

[51] Int. Cl.⁶ .............. H01J 1/62; H01J 63/04; H05B 33/14
[52] U.S. Cl. ............ 313/503; 313/506; 313/507
[58] Field of Search ................. 313/501, 503, 313/506, 507, 509; 428/690, 917; 359/221; 315/169.3

[56] References Cited

U.S. PATENT DOCUMENTS

| | | | |
|---|---|---|---|
| 4,356,429 | 10/1982 | Tang | 313/503 |
| 4,547,702 | 10/1985 | Schrank | 313/509 |
| 4,666,793 | 5/1987 | Hirate | 313/509 |
| 4,720,436 | 1/1988 | Ohseto et al. | 313/503 |
| 5,059,862 | 10/1991 | VanSlyke et al. | 313/503 |
| 5,189,549 | 2/1993 | Leventis et al. | 359/271 |
| 5,306,572 | 4/1994 | Ohashi et al. | 313/503 |
| 5,317,169 | 5/1994 | Nakano et al. | 313/503 |
| 5,374,489 | 12/1994 | Imai et al. | 313/503 |
| 5,444,330 | 8/1995 | Leventis et al. | 313/506 |
| 5,656,888 | 8/1997 | Sun et al. | 313/503 |

FOREIGN PATENT DOCUMENTS

| | | |
|---|---|---|
| 3-152897 | 6/1991 | Japan . |
| 7-142169 | 6/1995 | Japan . |

*Primary Examiner*—William L. Oen
*Attorney, Agent, or Firm*—Sughrue, Mion, Zinn, Macpeak & Seas, PLLC

[57] ABSTRACT

A thin film electroluminescent element has a color changing layer doped with green luminescent material and red fluorescent material and separated from an electroluminescent layer for generating blue light for converting the blue light to green light and the green light to red light, and the separation results in reduction of trapping center in the electroluminescent layer.

7 Claims, 10 Drawing Sheets

THIN FILM ELECTROLUMINESCENT ELEMENT EASILY REGULATING EMITTED LIGHT TO WHITE

FIELD OF THE INVENTION

This invention relates to a thin film electroluminescent element and, more particularly, to a thin film electroluminescent element easily regulating emitted light to white color.

DESCRIPTION OF THE RELATED ART

A typical example of the thin film electroluminescent element is illustrated in FIG. 1 of the drawings. The prior art thin film electroluminescent element is fabricated on a glass substrate 1. A semi-transparent anode 2a of indium-thin-oxide is formed on the major surface of the glass substrate 1. The semi-transparent anode 2a is overlain by a hole transporting layer 2b, and an electroluminescent layer 2c is laminated on the hole transporting layer 2b. A cathode 2d is formed on the electroluminescent layer 2c, and an electric power source 3 is connected between the semi-transparent anode 2a and the cathode 2d. The electroluminescent layer 2c is doped with fluorescent material for green light and fluorescent material for red light. The fluorescent material for green light and the fluorescent material for red light are hereinbelow referred to as "green dopant" and "red dopant", respectively.

When the electric power source 3 appropriately biases the semi-transparent anode 2a, holes are injected through the hole transporting layer 2a into the electroluminescent layer 2c, and the cathode 2d injects electrons into the luminescent layer 2c. The holes are recombined with the electrons, and the electroluminescent layer 2c emits light.

The electroluminescent layer 2c inherently emits blue light, and the green dopant and the red dopant cause the energy transfers to take place from the blue light to the green light and from the green light to the red light.

FIG. 2 illustrates the photo-luminescent phenomenon in the electroluminescent layer 2c. Dots and bubbles represent the green dopant and the red dopant. When the holes and the electrons are injected into the electroluminescent layer 2c, the recombination between the holes and the electrons results in blue light indicated by arrow AR1. The blue light AR1 is partially radiated from the electroluminescent layer 2c, and is partially absorbed by the dots. The dots convert the blue light AR1 to green light indicated by arrow AR2. The green light AR2 is partially radiated from the electroluminescent layer 2c, and is partially absorbed by the bubbles. The bubbles convert the green light AR2 to red light indicated by arrow AR3, and the red light AR3 is radiated from the electroluminescent layer 2c. Thus, the electroluminescent layer 2c radiates the blue light AR1, the green light AR2 and the red light AR3. If the blue light AR1, the green light AR2 and the red light AR3 are equally proportioned, the electroluminescent layer radiate the light in white color.

FIG. 3 illustrates the photo-luminescent phenomenon. The blue light B is converted to the green light at a certain probability phi, and the residual blue light (1–phi) is radiated to the outside. Similarly, the green light G is converted to the red light R at a certain probability psi, and the residual green light (1–psi) is radiated to the outside. Thus, the blue light B, the green light G and the red light R are taken out at (1–phi), (phi×psi) and phi(1–psi), respectively. The probability phi and the probability psi are depending upon the dopant concentrations, respectively. For this reason, if the green dopant and the red dopant are appropriately regulated, the electroluminescent layer 2c equally radiates the blue light, the green light and the red light, and the equally regulated primary three colors whiten the radiated light.

Thus, the prior art thin film electroluminescent element theoretically radiates white light. However, it is difficult to exactly whiten the radiated light. As described hereinbefore, the green dopant and the red dopant convert the blue light to the green light and the green light to the red light. There are various dopants. The dopants are categorized into a carrier trapping type and an energy transition type, and the wavelength of the light is widely different between the carrier trapping type and the energy transition type. Therefore, it is necessary to select an appropriate combination from various candidates. Moreover, even if a suitable combination is found, the dopants are doped into an electroluminescent layer by using a co-evaporation technique, and it is not easy to exactly regulate the dopant concentrations to target values. This results in tint slightly deviated to blue or red.

Another problem is a low energy efficiency. Although the potential applied to an organic electroluminescent layer theoretically is smaller than that of an inorganic electroluminescent layer, the dopants trap the carriers, and increase the potential for emitting light.

SUMMARY OF THE INVENTION

It is an object of the present invention to provide a thin film electroluminescent element which emits light in white color without decrease of the energy efficiency.

To accomplish the object, the present invention proposes to separate a photo-converting layer from a photoluminescent medium.

In accordance with one aspect of the present invention, there is provided a thin film electroluminescent element fabricated on a substrate comprising: an anode applied with an electric potential; a cathode negatively biased with respect to the anode; a photoluminescent medium provided between the anode and the cathode, and having a luminescent layer causing holes injected from the anode to be recombined with electrons injected from the cathode for emitting a first light in a first color through one of the anode and the cathode; and a color changing medium formed over a surface of the one of the anode and the cathode, and containing a first photo-converting material for converting a part of the first light to a second light in a second color and a second photo-converting material for converting a part of the second light to a third light in a third color, thereby radiating a remaining part of the first light, a remaining part of the second light and the third light.

BRIEF DESCRIPTION OF THE DRAWINGS

The features and advantages of the thin film electroluminescent element and the process according to the present invention will be more clearly understood from the following description taken in conjunction with the accompanying drawings in which.

DESCRIPTION OF THE PREFERRED EMBODIMENTS

First Embodiment

Figure 1:
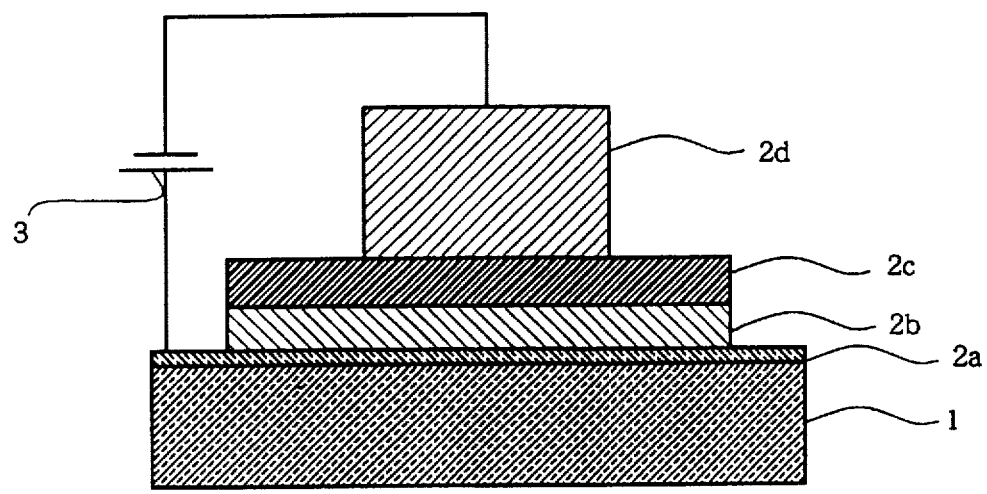
FIG. 1 is a cross sectional view showing the structure of the prior art thin film electroluminescent element.
Figure 2:
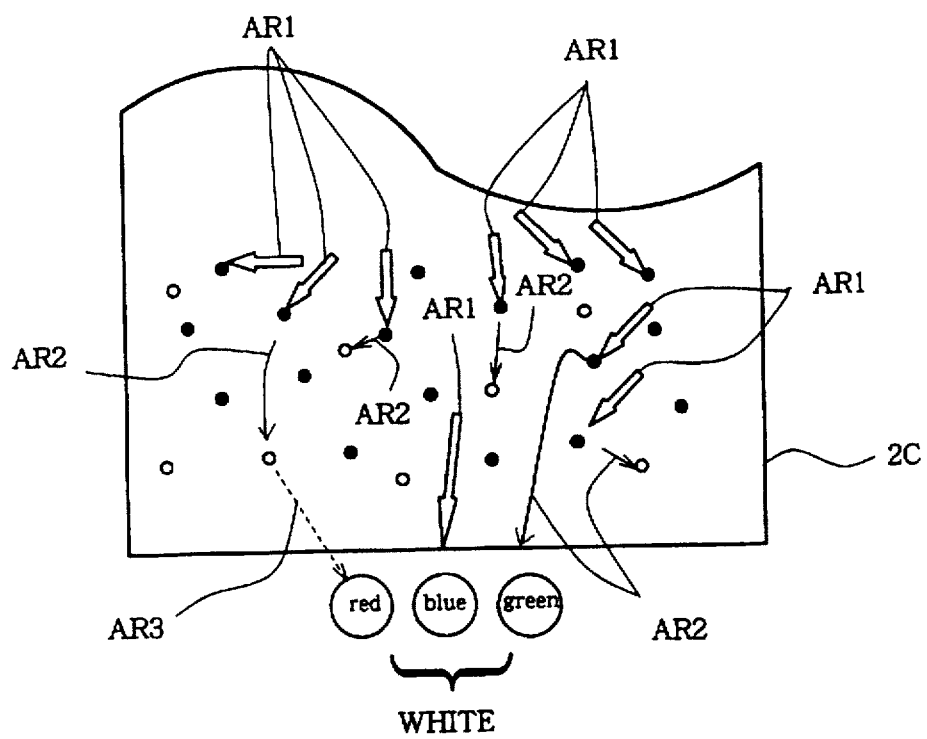
FIG. 2 is a view showing the photo-luminescent phenomenon in the organic electroluminescent layer incorporated in the prior art thin film electroluminescent element.
Figure 3:
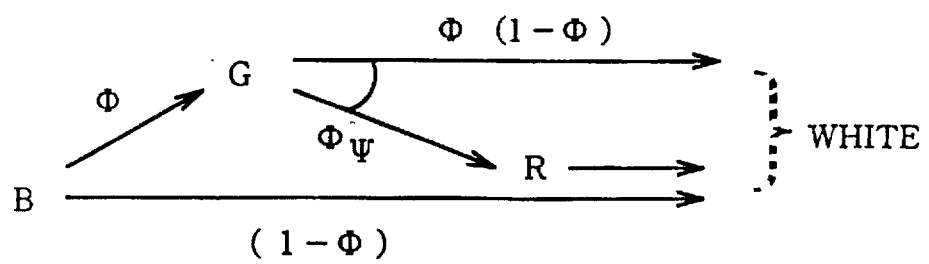
FIG. 3 is a view showing the photo-luminescent phenomenon.
Figure 4:
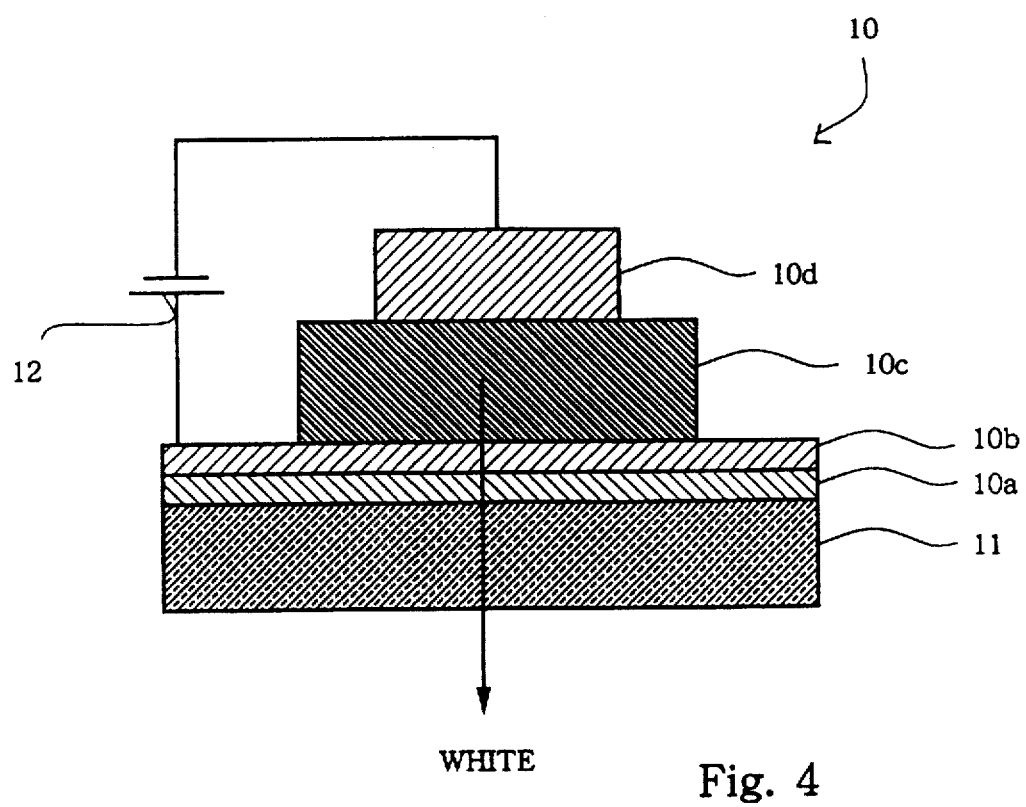
FIG. 4 is a cross sectional view showing the structure of a thin film electroluminescent element according to the present invention.

Referring to FIG. 4 of the drawings, a thin film electroluminescent element 10 embodying the present invention is fabricated on a glass substrate 11. The thin film electroluminescent element 10 comprises a color changing medium 10a formed on major surface of the glass substrate 11, a semi-transparent anode 10b laminated on the color changing medium 10a, an electroluminescent layer 10c formed on the semi-transparent anode 10b and a cathode 10d provided on the electroluminescent layer 10c. An electric power source 12 is connected between the semi-transparent anode 10b and the cathode 10d.

The color changing medium 10a is mainly formed of organic binder, green luminescent dopant and red fluorescent dopant, and the green luminescent dopant and the red fluorescent dopant are dispersed into the organic binder. In this instance, the green luminescent dopant is zinc sulfide (ZnS) added with copper (Cu), and the red fluorescent dopant is zinc sulfide added with manganese (Mn). The green luminescent dopant and the red fluorescent dopant serve as blue-to-green converting material and green-to-red converting material, respectively.

The semi-transparent anode 10b is formed of indium-tin-oxide sometimes abbreviated as "ITO", and the indium-tin-oxide is deposited on the color changing medium 10a by using an electron beam epitaxy, ion-plating technique or sputtering.

The electroluminescent layer 10c is formed of organic compound, and the organic compound generates blue light through recombination of holes and electrons. The organic compound available for the electroluminescent layer 10c is disclosed in Japanese Patent Publication of Unexamined Application (JPA) Nos. 3-152897 and 7-142169. Japanese Patent Publication of Unexamined Application No. 3-152897 teaches organic compounds in the stilbene system and organic compounds in the coumarin system. Japanese Patent Publication of Unexamined Application No. 3-152897 also teaches organic compounds available for the electroluminescent layer 10c, and the organic compounds disclosed therein are oxazole metal complex, a derivative of distyrylbenzen, styrylallylene containing polycarbonate, a derivative of oxadiazole, azomethine zinc complex and aluminum complex.

The organic compound is, by way of example, deposited on the semi-transparent cathode 10b by using a vacuum evaporation technique. Alternatively, the organic compound may be mixed with resin and solvent so as to coat the semi-transparent cathode 10b with the mixture. In this instance, the electroluminescent layer 10c serves as a photoluminescent medium.

The cathode 10d is formed of alloy containing gold, aluminum, indium, magnesium copper or silver, and the alloy is deposited by using the vacuum evaporation or the electron beam epitaxy. Metallic mixture may be deposited on the electroluminescent layer 10c through an evaporation.

The thin film electroluminescent element 10 behaves as follows. When the semi-transparent anode 10a positively biased to the cathode 10d, the semi-transparent anode 10a injects holes into the electroluminescent layer 10c, and the cathode 10d injects electrons into the electroluminescent layer 10c. The holes are recombined with the electrons, and blue light is emitted from the electroluminescent layer 10c. The blue light passes through the semi-transparent anode 10b, and is incident onto the color changing medium 10a.

Figure 5:
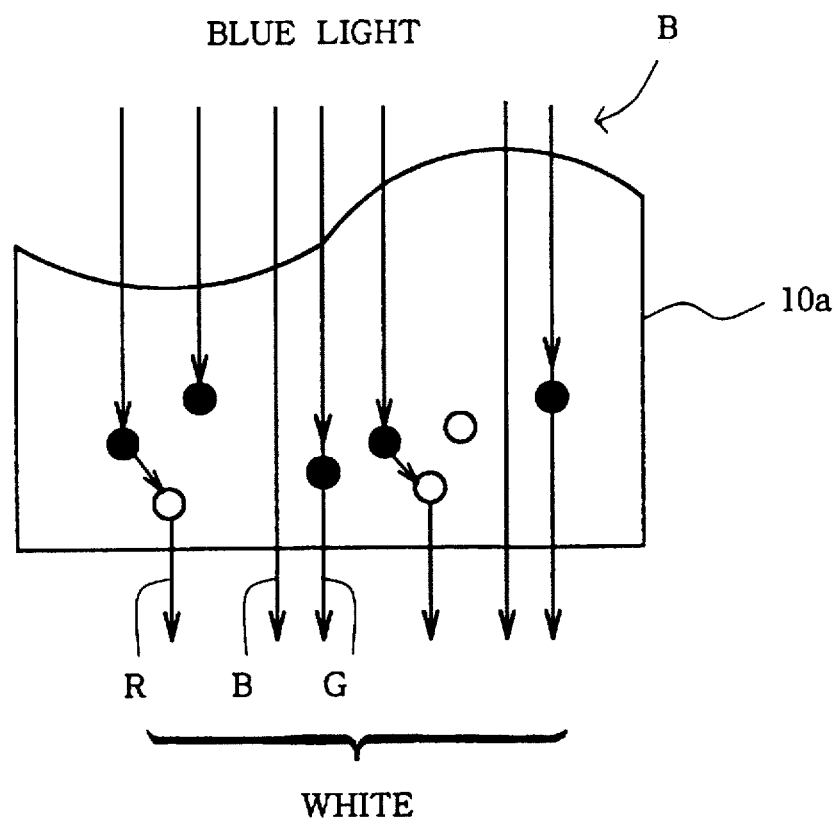
FIG. 5 is a view showing a photo-luminescent phenomenon in a luminescent layer incorporated in the thin film electroluminescent element.

FIG. 5 illustrates the blue light B incident onto the color changing medium 10a. As described hereinbefore, the color changing medium 10a contains the green luminescent dopant and the red fluorescent dopant, and dots and bubbles respectively stand for the green luminescent dopant and the red fluorescent dopant in FIG. 5. The blue light B partially passes through the color changing medium 10a and the glass substrate 11, and partially excites the green luminescent dopant. Then, the green luminescent dopant converts the blue light B to green light G at a first predetermined conversion efficiency. The green light G partially passes through the color changing medium 10a and the glass substrate 11, and partially excites the red fluorescent dopant so as to convert the green light to red light R at a second predetermined conversion efficiency. The first conversion efficiency and the second conversion efficiency are appropriately adjusted, and the blue light B, the green light G and the red light R are equally emitted from the glass substrate 11. This results in white light.

Second Embodiment

Figure 6:
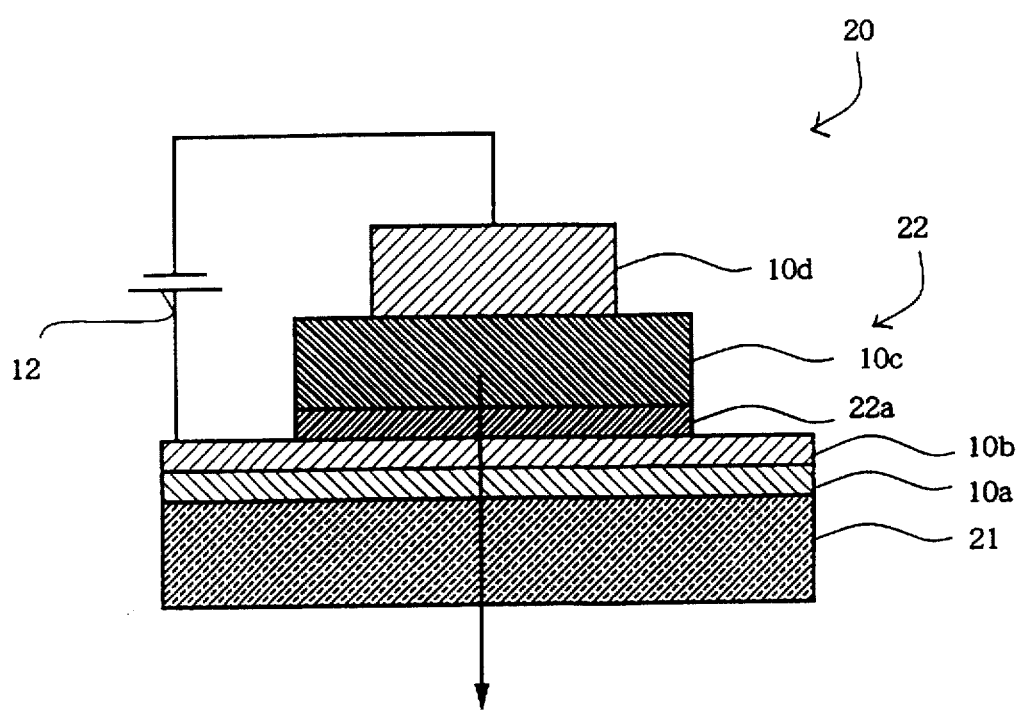
FIG. 6 is a cross sectional view showing the structure of another thin film electroluminescent element according to the present invention.

FIG. 6 illustrates another thin film electroluminescent element 20 embodying the present invention. The thin film electroluminescent element 20 is fabricated on a glass substrate 21, and is similar to the thin film electroluminescent element 10 except for a semi-transparent hole injecting layer 22a. For this reason, the other layers and electrodes are labeled with the same references used for the first embodiment without detailed description.

The semi-transparent hole injecting layer 22a is inserted between the semi-transparent anode 10b and the electroluminescent layer 10c, and is formed of hole transporting material such as, for example, N,N'-biphenyl-N,N'-bis (alpha-naphthyl)-1,1'-biphenyl-4,4'-diamine. Japanese Patent Publication of Unexamined Application No. 7-142169 teaches other hole transporting materials, i.e., aromatic amine compound, hydrazone compound, silazane compound, quinacridone compound, polyvinylcarbazole, and polysilane, and are also available for the hole injecting layer 22a.

The semi-transparent hole injecting layer 22a is deposited on the semi-transparent anode 10b by using a vacuum evaporation. The hole transporting material may be mixed with resin and solvent so as to coat the semi-transparent anode 10b with the mixture.

The hole injecting layer 22a does not allow the electrons to reach the semi-transparent anode 10b, and effectively confines the holes and the electrons in the electroluminescent layer 10c. The injected holes and the injected electrons similarly behave. The electroluminescent layer 10c emits blue light, and the color changing layer 10a converts the blue light to green light and the green light to red light. In this instance, the hole injecting layer 22a and the electroluminescent layer 10c as a whole constitute the photoluminescent medium.

Subsequently, description is made on a process of fabricating the thin film electroluminescent element with reference to FIGS. 7A to 7D. The process starts with preparation of the glass substrate 21.

Figure 7A:
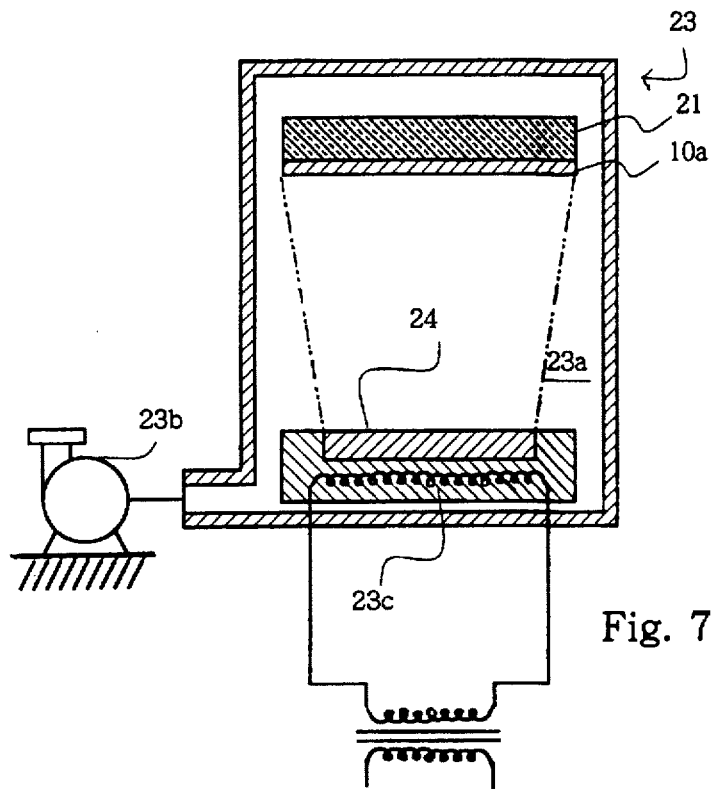
FIGS. 7A to 7D are schematic views showing a process of fabricating the thin film electroluminescent element shown in FIG. 6.

The green luminescent dopant and the red fluorescent dopant are mixed at a predetermined ratio into organic binder, and the mixture 24 is opposed to the major surface of the glass substrate 21 in a chamber 23a of a vacuum evaporation system 23. A vacuum pump 23b creates vacuum in the chamber 23a, and a heater 23c heats the mixture 24. The mixture 24 is evaporated, and is deposited on the major surface of the glass substrate 21. Thus, the color changing layer 10a is formed on the major surface of the glass substrate 21 as shown in FIG. 7A.

Figure 7B:
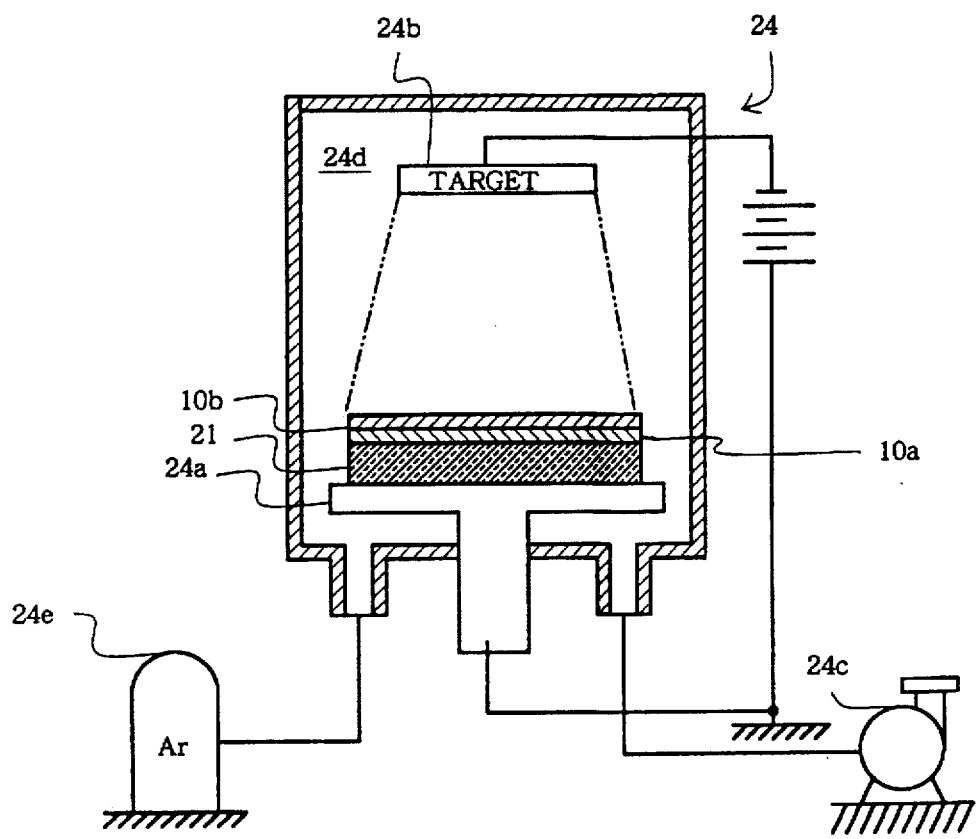

Subsequently, the glass substrate 21 covered with the color changing layer 10a is placed on a susceptor 24a of a sputtering system 24. A target 24b of indium-tin-oxide is opposed to the color changing layer 10a. A vacuum pump 24c evacuates a chamber 24d, and argon is supplied from an argon gas source 24e to the chamber 24d. The chamber 24d is maintained between room temperature and 500 degrees in centigrade. The target 24d is negatively biased with respect to the susceptor 24a, and argon ion is generated from the argon gas. The argon ion is attracted to the target 24b. The indium-tin-oxide flux falls on the color changing layer 10a, and the indium-tin-oxide is deposited to 150 nanometers thick on the color changing layer 10a. Thus, the semi-transparent anode 10b of indium-tin-oxide is formed on the color changing layer 10a as shown in FIG. 7B.

Subsequently, the glass substrate 21 is placed in a chamber 25a of a resistance heating evaporation system 25, and the semi-transparent anode 10b is opposed to an evaporation source 25b of the hole transporting material. A vacuum pump 25c evacuates the chamber 25a, and a heater 25d heats the evaporation source 25b to room temperature to 300 degrees in centigrade. The hole transporting material is deposited to 50 to 100 nanometers thick on the semi-transparent anode 10b, and the hole injecting layer 22a is laminated on the semi-transparent anode 10b.

Figure 7C:
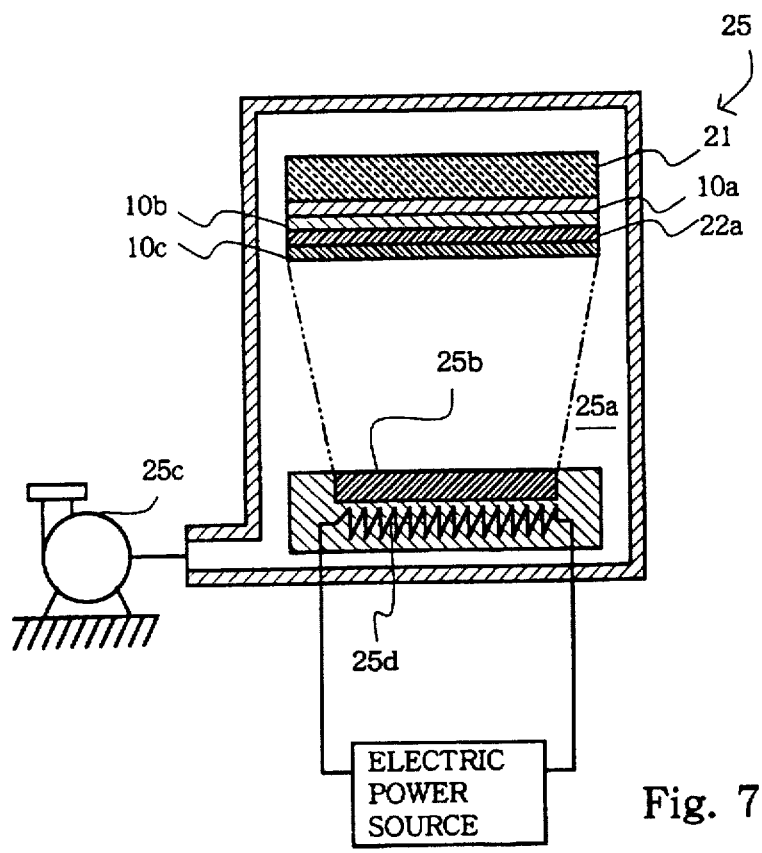

Subsequently, the evaporation source 25b is changed to the organic compound, and the organic compound is heated to the room temperature to 300 degrees in centigrade, again. The organic compound is deposited to 50 to 100 nanometers thick on the hole injecting layer 22a, and the hole injecting layer 22a is overlain by the electroluminescent layer 10c as shown in FIG. 7C.

Figure 7D:
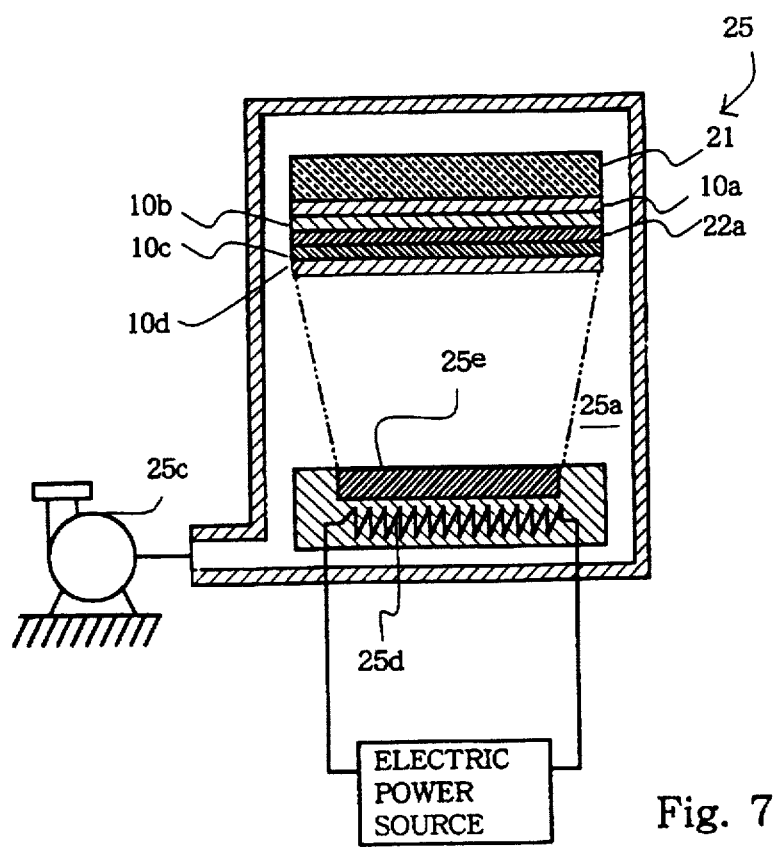

Finally, the electroluminescent layer 10c is opposed to an evaporation source 25e of the alloy, and the alloy is deposited to 100 to 500 nanometers thick on the electroluminescent layer 10c at 300 degrees in centigrade or less so as to form the cathode 10d as shown in FIG. 7D.

Third Embodiment

Figure 8:
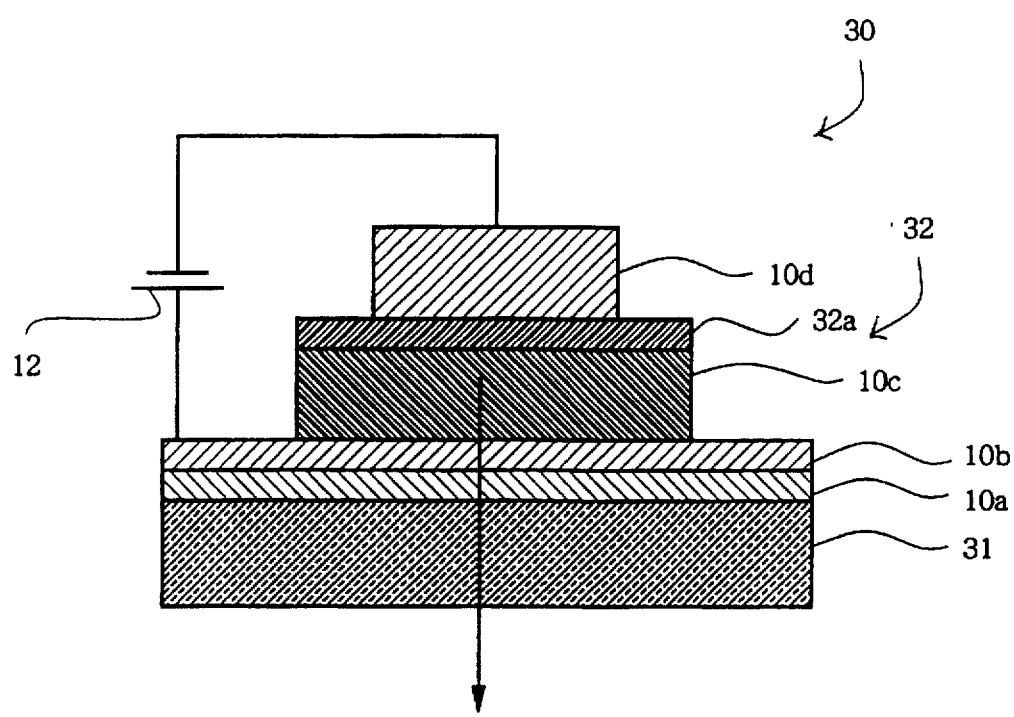
FIG. 8 is a cross sectional view showing the structure of yet another thin film electroluminescent element according to the present invention.

FIG. 8 illustrates yet another thin film electroluminescent element 30 embodying the present invention. The thin film electroluminescent element 30 is fabricated on a glass substrate 31, and is similar to the thin film electroluminescent element 30 except for an electron injecting layer 32a. For this reason, the other layers and electrodes are labeled with the same references used for the first embodiment without detailed description.

The electron injecting layer 32a is inserted between the electroluminescent layer 10c and the cathode 10d, and is, by way of example, formed of a derivative of oxadiazole, which is taught in Japanese Patent Publication of Unexamined Application No. 7-142169. The derivative of oxadiazole is deposited on the electroluminescent layer by using a vacuum evaporation. Alternatively, the derivative of oxadiazole is mixed with resin and solvent, and the mixture is coated on the electroluminescent layer 10c.

The electron injecting layer 32a does not allow the injected hole to reach the cathode 10d, and confines them in the electroluminescent layer 10c. In this instance, the electroluminescent layer 10c and the electron injecting layer 32a as a whole constitute a photoluminescent medium 32.

Fourth Embodiment

Figure 9:
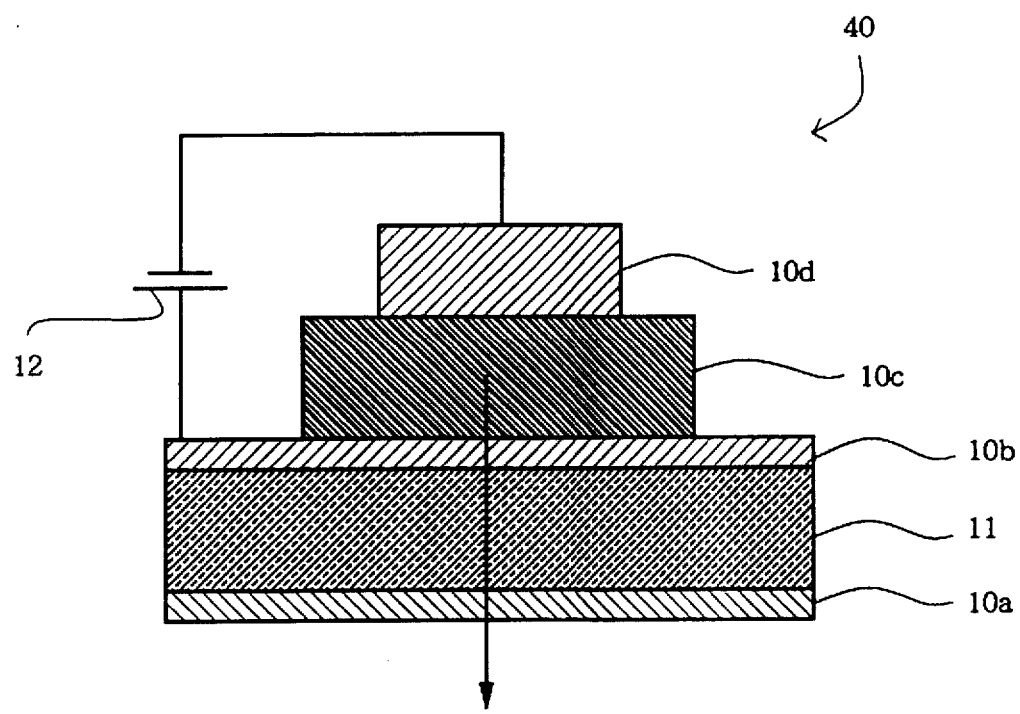
FIG. 9 is a cross sectional view showing the structure of still another thin film electroluminescent element according to the present invention.

FIG. 9 illustrates still another thin film electroluminescent element 40 embodying the present invention. Only the position of the color changing layer 10a is different between the electroluminescent element 10 and the electroluminescent element 40, and all the layers and the electrodes are labeled with the same references designating corresponding layers and electrodes of the first embodiment.

As will be appreciated from the foregoing description, the color changing layer 10a is separated from the electroluminescent layer 10c, and the green luminescent dopant and the red fluorescent dopant do not serve as a trapping center in the electroluminescent layer 10c. Although the color changing medium is causative of an energy loss, the material for the color changing medium is selected from a wide variety of candidates, and the energy loss is decreased as little as possible. For this reason, the energy efficiency is surely improved.

The organic materials for the electroluminescent element are easily damaged by heat. When the organic materials are heated to 100 degrees in centigrade, the organic materials are crystallized, and the non-amorphous materials contain a large amount of defects. This results in deterioration of light-emitting efficiency. However, heat generation is allowed before the formation of the organic layers. The process according to the present invention deposits the color changing medium before the formation of the photoluminescent medium formed of organic compound. The manufacturer can select appropriate inorganic/organic compounds for the color changing layer even if the inorganic/organic compounds radiate heat during the deposition. Thus, the process according to the present invention allows the electroluminescent to radiate the white light.

Although particular embodiments of the present invention have been shown and described, it will be obvious to those skilled in the art that various changes and modifications may be made without departing from the spirit and scope of the present invention.

For example, still another thin film electroluminescent element according to the present invention may have both of the hole injecting layer and the electron injecting layer.

What is claimed is:

1. A thin film electroluminescent element fabricated on a substrate comprising:

an anode applied with an electric potential;

a cathode negatively biased with respect to said anode;

a photoluminescent medium provided between said anode and said cathode, and having a luminescent layer causing holes injected from said anode to be recombined with electrons injected from said cathode for emitting a first light in a first color through one of said anode and said cathode; and a color changing medium formed over a surface of said one of said anode and said cathode, and containing a first photo-converting material for converting a part of said first light to a second light in a second color and a second photo-converting material for converting a part of said second light to a third light in a third color, thereby radiating a remaining part of said first light, a remaining part of said second light and said third light.

2. The thin film electroluminescent element as set forth in claim 1, in which said luminescent layer generates said first light in blue color, and said color changing medium converts said part of said first light in blue color to said second light in green color and said part of said second light in green color to said third light in red color.

3. The thin film electroluminescent element as set forth in claim 2, in which said photoluminescent medium further includes a hole injecting layer inserted between said anode and said luminescent layer so as to allow only said holes to pass therethrough.

4. The thin film electroluminescent element as set forth in claim 2, in which said photoluminescent medium further includes an electron injecting layer inserted between said cathode and said luminescent layer so as to allow only said electrons to pass therethrough.

5. The thin film electroluminescent element as set forth in claim 2, in which said first photo-converting material and said second photo-converting material are zinc-sulfide doped with copper and zinc-sulfide doped with manganese, respectively.

6. The thin film electroluminescent element as set forth in claim 5, in which said color changing medium is inserted between said substrate and said anode, and said substrate and said anode have a transparency to light.

7. The thin film electroluminescent element as set forth in claim 5, in which said color changing medium is formed on a major surface of said substrate opposite to another major surface where said anode is formed, and said substrate and said anode have a transparency to light.

* * * * *